United States Patent [19]

L'Esperance, III et al.

[11] Patent Number: 5,194,948
[45] Date of Patent: Mar. 16, 1993

[54] ARTICLE ALIGNMENT METHOD AND APPARATUS

[75] Inventors: Leroy D. L'Esperance, III, Blackwood, N.J.; Hung N. Nguyen, Bensalem; Yiu-Man Wong, Wescosville, both of Pa.

[73] Assignee: AT&T Bell Laboratories, Murray Hill, N.J.

[21] Appl. No.: 891,089

[22] Filed: Jun. 1, 1992

Related U.S. Application Data

[62] Division of Ser. No. 691,658, Apr. 26, 1991, Pat. No. 5,152,055.

[51] Int. Cl.$^5$ .............................................. H04N 7/18
[52] U.S. Cl. ................................... 358/106; 358/101; 29/740; 29/833; 29/834
[58] Field of Search ........................ 358/106, 101, 93; 382/8; 29/740, 833, 834

[56] References Cited

U.S. PATENT DOCUMENTS

| | | | |
|---|---|---|---|
| 3,899,634 | 8/1975 | Montone | 358/101 |
| 4,899,921 | 2/1990 | Bendat | 358/101 |
| 4,980,971 | 1/1991 | Bartschat | 29/833 |
| 5,058,178 | 8/1991 | Ray | 358/106 |
| 5,084,959 | 2/1992 | Ando | 29/740 |

*Primary Examiner*—Tommy P. Chin
*Assistant Examiner*—Bryan S. Tung
*Attorney, Agent, or Firm*—Robert B. Levy

[57] ABSTRACT

Alignment of each of a plurality of depending first conductive members (16), in an array of orthogonal rows and columns on an article (12), with a corresponding second conductive member (18) arranged in a like array on a substrate (14), is accomplished by positioning the article in spaced relationship from the substrate. The arrays of first and second conductive members (16,18) are first angularly aligned by rotating the article (12) so that the offset between a first column of first and second conductive members on the article and substrate, respectively, as seen by a television camera (32) at a first end of the article and substrate is the same as the offset between a second column of first and second members on the article and substrate, respectively, at the other end thereof as seen by a second camera (30). Translational alignment of the arrays of first and second conductive members (16,18) is accomplished by displacing the substrate (14) so that the first and second conductive members in the first column on the article and substrate, respectively, are aligned at the same time that the first and second conductive members in the first row of first and second conductive members on the article and substrate, respectively, are aligned.

4 Claims, 2 Drawing Sheets

ARTICLE ALIGNMENT METHOD AND APPARATUS

This is a division of application Ser. No. 691,658 filed Apr. 26, 1991.

TECHNICAL FIELD

This invention relates to a method, and associated apparatus, for aligning each of a plurality of depending first conductive members on an article with a corresponding one of a plurality of second conductive members on a substrate.

BACKGROUND OF THE INVENTION

Presently, there is an effort by many electronics manufacturers to achieve ever higher levels of performance by greater integration of individual components in a single assembly. One technique for achieving large scale integration is to interconnect each of a plurality of Very Large Scale Integrated (VLSI) circuit chips by way of a silicon substrate, or the like, rather than to package the devices and then connect the packaged devices via a conventional circuit board. The most common method for attaching an integrated circuit chip to such a silicon substrate is to employ a technique known as "flip-chip" bonding, which is practiced by first attaching a solder bump to each of a plurality of bonding areas on the surface of the substrate and to each of a plurality of bonding areas on the undersurface of the chip. The chip is then placed on the substrate so that each solder bump on the chip is aligned with a corresponding bump on the substrate. Thereafter, the integrated circuit chip is thermocompressively bonded to the substrate.

In practice, there are usually a large number of connections to be made between each integrated circuit chip and the substrate. As a consequence, each integrated circuit chip has a large number of closely spaced solder bumps, usually arranged in a rectangular array of rows and columns, as does the substrate. In U.S. Pat. No. 4,980,971, issued on Jan. 1, 1991, to M. K. Bartschat et al., and assigned to AT&T Bell Laboratories, there is disclosed a system for precisely placing a semiconductor chip on a substrate with the aid of a robotic arm. To achieve precise alignment, a first television camera is carried by the robotic arm and is trained downward for capturing the image of the substrate to establish the position of each of a pair of fiducials thereon. A second camera, which is stationary, is trained to look upward at the robotic arm to observe the undersurface of a chip carried by the arm to establish the position of each of a pair of reference points on the chip. The output of each of the first and second cameras is processed by a machine vision processor to establish the precise position of the solder bumps on the chip and the position of the bonding areas on the substrate to allow the robot to precisely place the chip on the substrate.

The Bartschat et al. system is capable of achieving a placement tolerance on the order of 10 microns, which is satisfactory in most instances. However, there are currently integrated circuits which have such a large number of closely spaced solder bumps that a placement accuracy on the order of 3 microns is required. Heretofore, no known placement system could achieve such a high placement accuracy.

Thus, there is a need for a technique for precisely placing an article, such as an integrated circuit chip, on a substrate with a very fine placement accuracy.

SUMMARY OF THE INVENTION

Briefly, in accordance with a preferred embodiment of the invention, there is provided a technique for precisely registering an article on a substrate such that each of a plurality of first conductive members, depending from the article in an orthogonal array of rows and columns, is aligned with a corresponding one of second conductive members, arranged on the substrate in a like array. To accomplish such alignment, the article is initially placed in spaced relationship from the substrate so that each of the first conductive members on the article is proximate to (but not necessarily precisely aligned with) its corresponding second conductive member on the substrate. Next, a first image of at least a portion of a first column of first and second conductive members, respectively, on the article and substrate, respectively, closest to a first end of each is captured, as is a second image of a portion of a second column of first and second conductive members, respectively, on the article and substrate, respectively, at a second, opposite end thereof. A comparison is then made between the two images to determine whether the article is angularly aligned with the substrate (i.e., whether the offset between the first and second conductive members in the first column on the article and the substrate is the same as in the second column on the article and substrate thereof). If not, the article is rotated in accordance with the results of such comparison so that the array of first conductive members on the article is angularly aligned with the array of second conductive members on the substrate.

Once the angular alignment is established between the arrays of first and second conductive members on the substrate and the article, respectively, then the translational alignment of the arrays is established so that each of the first and second conductive members is precisely aligned with the other. To establish such alignment, a third image of at least a portion of a first row of first and second conductive members on the article and substrate, respectively, closest to one of the sides thereof (orthogonal to each of the ends) is captured. A comparison is made between the alignment of each first conductive member to each second conductive member in each of the first and third images. The article is then translated relative to the substrate in accordance with the results of such comparison so that each of the first conductive members in each image is aligned with a corresponding one of the second conductive members in the same image.

DETAILED DESCRIPTION

Figure 1:
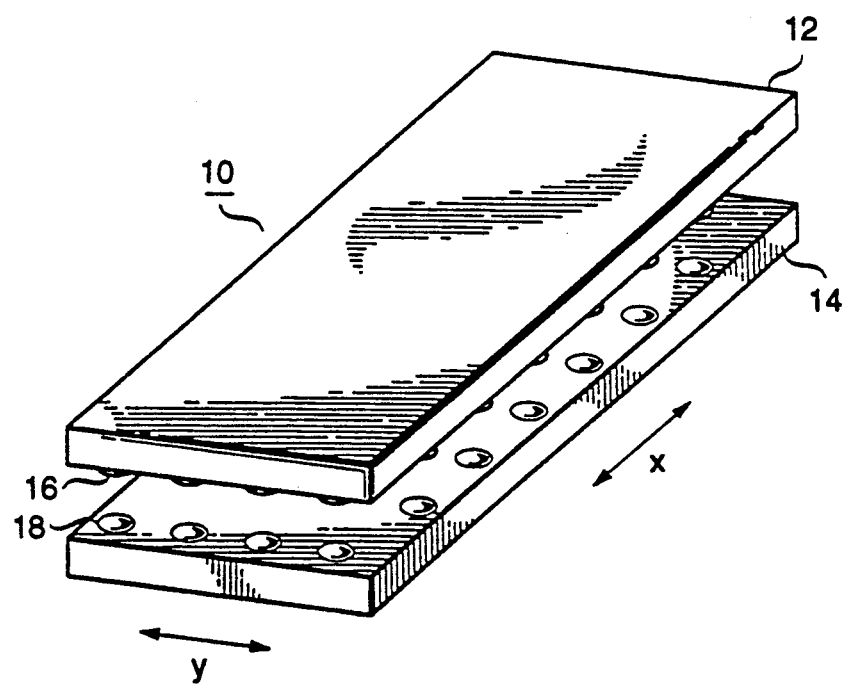
FIG. 1 is a perspective view of a prior-art electronic assembly comprised of a chip placed on a substrate.

FIG. 1 is a perspective view of a prior-art electronic assembly 10 which is comprised of an integrated circuit chip 12 and an interconnection substrate 14. For illustrative purposes, the chip 12 is shown spaced slightly above and thus, not connected to, the substrate 14. In practice, the chip 12 is seated on, and is connected to the substrate 14 by way of a plurality of depending first conductive members 16 (e.g., solder bumps) arranged in an array of uniformly spaced rows and orthogonal columns on the chip and a like array of upwardly extending second conductive members 18 on the substrate. The rows and columns of the first and second conductive members 16 and 18 on the chip 12 and the substrate 14, respectively, each lie along a separate one of the x and y axes.

Generally, there is a high level of integration associated with the chip 12 which necessitates a large number of connections to the substrate 14. In some instances, there may be as many as 512 rows by 512 columns of first and second conductive members 16 and 18, respectively, arrayed on the chip 12 and substrate 14, respectively. To keep the physical size of the chip 12 small (typically on the order of 0.64 cm), the first conductive member 16 is made small and is closely spaced (as are the second conductive members 18 on the substrate 14). Typically, the first and second conductive members 16 and 18 on the chip 12 and substrate 14, respectively, are often no larger than 25 microns in diameter and 5 microns high, with the spacing (pitch) between adjacent members being no greater than 50 microns. Under such conditions, a placement tolerance (accuracy) of no more than 3 microns is required to assure that each of the first conductive members 16 on the chip 12 can be bonded to its corresponding second conductive member 18 on the substrate 14 with no member-to-member overlap.

Figure 2:
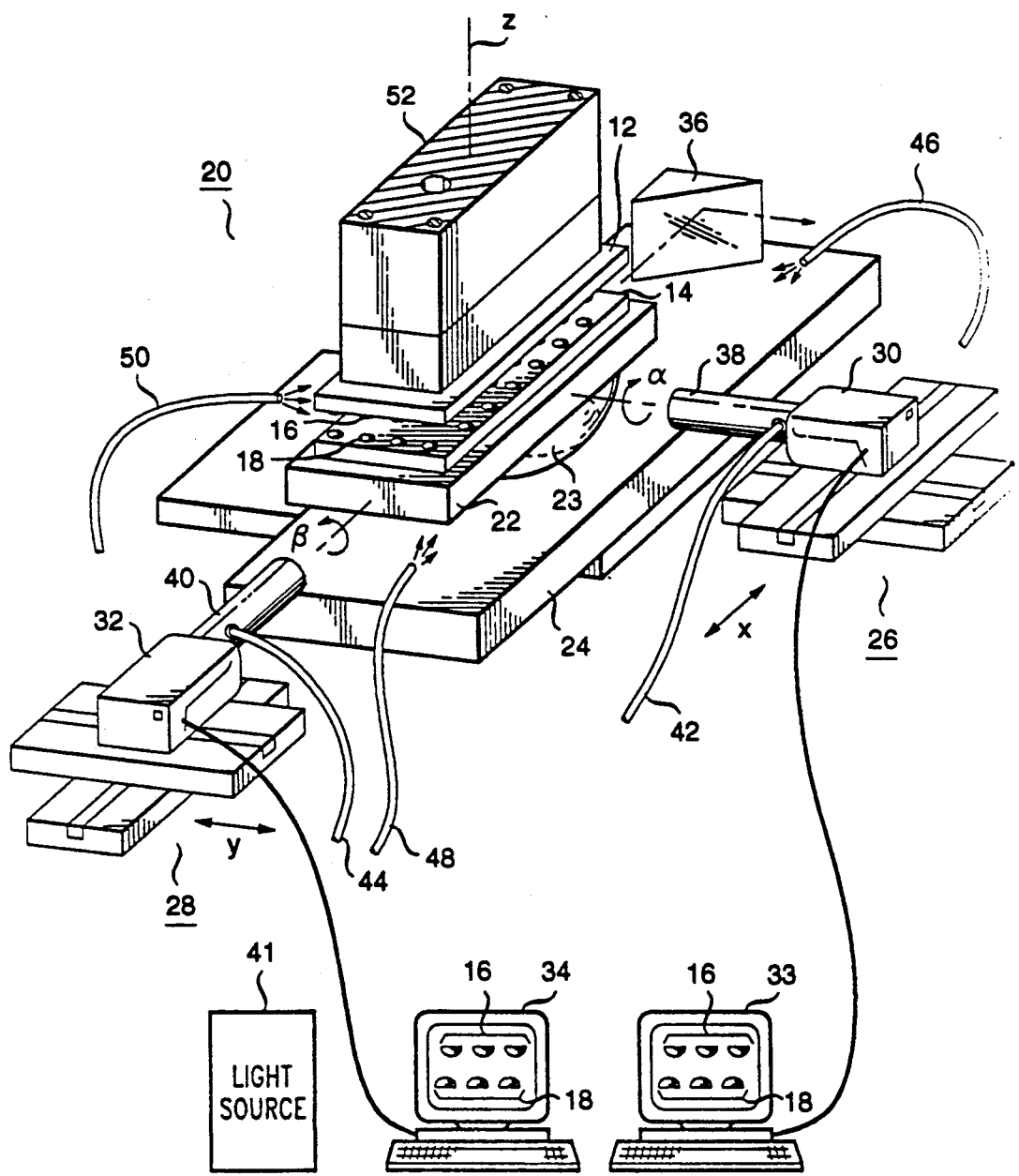
FIG. 2 is a block perspective view of a system, in accordance with a preferred embodiment of the invention, for precisely placing the chip on the substrate of FIG. 1.

Referring now to FIG. 2, there is shown a system 20, in accordance with the invention, for precisely registering the chip 12 with the substrate 14 such that each of the first conductive members 16 is aligned with its corresponding second conductive member 18 to facilitate bonding of the members to each other by well-known means, such as thermocompression bonding. The system 20 includes a substrate holder 22 which supports the substrate 14 on a tilt mechanism or stage 23, capable of tilting (rotating) the substrate holder 22, and hence, the substrate 14, about each of a pair of rotational axes $\alpha$ and $\beta$ which are coplanar with, but orthogonal to, the x and y axes, respectively. The tilt mechanism 23 rests on an x-y stage 24 capable of very precise movement along both the x and y axes. Typically, the slide 24 has an accuracy on the order of one micron or less. In addition to the stage 24, the system 20 also includes a pair of stages 26 and 28, each having a precision on the order of ten microns.

The stages 26 and 28 each support a separate one of a pair of television cameras 30 and 32, respectively, each camera having its output coupled to a separate one of a pair of video monitors 33 and 34, respectively. The cameras 30 and 32 are trained so that each has its optical axis perpendicular to a side and first end, respectively, of the substrate 14 (and the chip 12 positioned thereabove). In practice, the substrate 14 is placed in the substrate holder 22 so that the sides and ends of the substrate are parallel to the x and y axes, respectively. In this way, the camera 30 will capture the image of at least a portion of a first (i.e., outermost) row, respectively, of first and second conductive members 16 and 18 on a first side of the chip 12 and the substrate 14, respectively, while the camera 32 will image at least a portion of a first (i.e., outermost) column of members at a first end of the chip and substrate.

As indicated, the second conductive members 18 on the substrate 14 (as well as the first conductive members 16 on the chip 12) are typically small, and, therefore, to obtain a sufficiently high resolution thereof, the optics (not shown) of each of the cameras 30 and 32 are configured so that only a small number of the first and second conductive members within a separate one of the first rows and first columns, respectively, closest to each camera will be imaged thereby. The slides 26 and 28 on which each of the cameras 30 and 32, respectively, are mounted allow each camera to span the first and second conductive members 16 and 18 in each first row and each first column, respectively, closest to each camera. Further, each of the slides 26 and 28 also serves to displace its corresponding camera 30 and 32 to and from the first side and first end, respectively, of the chip and substrate 14.

As seen in FIG. 2, a mirror 36 is placed on the x-y stage 24 facing the end of the substrate 14 opposite the one imaged by the camera 32. The mirror 36 reflects the image of at least a portion of a second column of first and second conductive members 16 and 18, respectively, of the chip 12 and the substrate 14, respectively, at a second end thereof, into the camera 30 when the camera has been displaced so as to directly face the mirror.

To assure that the substrate 14 (as well as the chip 12 placed thereon as described hereinafter) is brightly illuminated, each of the cameras 30 and 32 carries a separate one of a pair of circular (e.g., ring-light-type) illuminators 38 and 40, each supplied with light from a light source 41 through a separate one of a pair of fiber optic bundles 44 and 42, respectively. The illuminators 38 and 40 each serve to illuminate the field of view of a separate one of the cameras 30 and 32, respectively, with bright field illumination. In addition, each of a pair of fiber optic bundles 46 and 48 carries light from the illumination source 41 to the substrate 14 (and the chip 12) to illuminate the first side of the substrate 14 (and the chip 12) imaged by the camera 30 with dark field illumination. Yet another fiber optic bundle 50 is provided to carry light from the illumination source 41 to a second side of the substrate 14 (and the chip 12), opposite the one imaged by the camera 30, to illuminate the first and second conductive members 16 and 18, respectively, imaged by the camera with dark field illumination.

Actual placement of the chip 12 on the substrate 14 is typically performed by an end effector 52 carried by a robot (not shown). The end effector 52 is configured to releasably engage the chip 12, typically by drawing a vacuum against its top surface. The robot (not shown), which carries the end effector 52, is selected so as to be capable of translating the end effector along both the x, y and z axes as well as rotating the effector in $\theta$ about the z axis. In this way, the end effector 52 can position the chip 12 above the substrate 14 and thereafter rotate the chip relative to the substrate to virtually eliminate any angular misalignment between them.

Prior to actually placing the chip 12 on the substrate 14 with the aid of the end effector 52, it is critical that planarity between the chip and the substrate be achieved. In other words, the chip 12 should be exactly parallel (within desired tolerance limits) to the substrate 14. Otherwise, it is possible that some of the first conductive members 26 may not make physical contact with their corresponding second conductive members 18 during bonding. Such planarity may be accomplished by proper adjustment of the tilt mechanism 23 prior to actual placement of the chip 12.

To accomplish proper adjustment of the tilt mechanism 23, a first slab (not shown) of nearly perfectly flat silicon is placed on the substrate holder 22 while a second nearly flat slab is engaged by the end effector 52 and positioned in spaced relationship above the first one. Once the first and second slabs are so positioned, the camera 30 is displaced along the x axis directly opposite one of the corners of the two slabs. The gap between the two slabs is measured, and then the camera 30 is displaced in along the x axis so as to be opposite another of the corners of the slabs, at which the gap between them is again measured. The difference between the two measurements (if any) determines the degree to which the tilt mechanism 23 should rotate the substrate holder 22 about the α axis to achieve planarity along the x axis.

A similar procedure is carried out to determine the degree to which the tilt mechanism 23 should rotate the substrate holder 22 about the β axis. First, the camera 32 is positioned opposite a corner of the two slabs and the gap between them is measured. Thereafter, the camera 32 is displaced along the y axis so as to be opposite another of the corners between the two slabs, whereupon the gap between them is again measured. The difference (if any) between the two gap measurements determines the degree to which the tilt mechanism 23 rotates the substrate holder 22 about the β axis to achieve planarity along the y axis.

In practice, the planarity adjustments just described are made once at the outset of chip placement, using two separate, very flat reference slabs, rather than with an actual chip 12 and substrate 14 which themselves could be non-planar. Once the planarity adjustments have been made, it is usually not necessary to make any further adjustments each time a chip 12 is placed on a substrate 14. Adjusting the tilt mechanism 23 at the outset of placement of the chip 12 in accordance with the images captured by the cameras 30 and 32 allows for a very high degree of planarity which simplifies the process of achieving both rotational and translational alignment between the chip and the substrate 14 prior to actual bonding.

Actual placement of the chip is accomplished by first manipulating the end effector 52 to pick up the chip 12 and then to place the chip on the substrate 14 prior to actual bonding. Even though care is taken when displacing the end effector 52 to locate the chip 12 above the substrate 14 so that each of the first conductive members 16 is aligned with its corresponding second conductive member 18, position errors in both x and y as well as θ will likely prevent true alignment. In accordance with the invention, the images of the first and second conductive members 16 and 18 captured by the cameras 30 and 32, and displayed on the monitors 33 and 34, respectively, can be utilized to operate the stage 24 to displace the substrate 14 in x and y, as well as to rotate the end effector 52 in θ to accomplish precise alignment of the chip 12 and the substrate 14.

To accomplish such alignment, the extent to which the array of first conductive members 16 on the chip 12 is angularly misaligned relative to the array of second conductive members 18 on substrate 14 first must be determined. Such a determination is made by operating the stage 26 to displace the camera 30 so that the camera's optical axis is now aligned with the image reflected by the mirror 36 of the second column of first and second conductive members 16 and 18, respectively, at the second end of the chip 12 and substrate 14, respectively, which lies closest to the mirror. The stage 28 is operated to displace the camera 32 so that the camera's optical axis is aligned with the optical axis of the camera 30, as reflected by the mirror 36. In this way, the cameras 30 and 32 should image corresponding sets of first and second conductive members 16 and 18 at opposite ends of the chip 12 and substrate 14, respectively, at the same time.

In the absence of any angular misalignment between the chip 12 and substrate 14, the image of those first and second conductive members 16 and 18 captured by the camera 32 should be identical to the image of the first and second conductive members captured by the camera 30. In other words, the lateral offset, if any, between the first and second conductive members 16 and 18 in the image displayed on the monitor 33 should be the same as the offset between the first and second conductive members in the image displayed on the monitor 34 when the chip 12 and substrate 14 are angularly aligned. If the chip 12 is angularly misaligned, then the relative offset between the first and second conductive members 16 and 18 in the two displayed images will differ. The degree to which the offset between the first and second conductive members 16 and 18 at the first and second ends of the chip 12 and substrate 14 differs varies with the degree of angular misalignment between the chip and the substrate. In the preferred embodiment shown in FIG. 2, an operator controls the rotation of the end effector 52 in accordance with the difference in the offset between the first and second conductive members 16 and 18 in the images visually observed on the monitors 33 and 34 to achieve angular alignment of the chip 12 to the substrate 14. To assist the operator, a measurement grid (not shown) may be superimposed on the screen of each monitor.

To achieve very precise angular alignment, it is desirable to displace the cameras 30 and 32, after rotating the end effector 52, to capture the image of another portion of the first and second conductive members 16 and 18 lying in the first and second columns, respectively, at the opposite ends of the chip 12 and substrate 14. The operator then observes the images displayed on the monitors 33 and 34 to detect angular misalignment. If the angular misalignment still exceeds a threshold value, the end effector 52 is rotated. The cameras 30 and 32 are then displaced again. This process is typically repeated until all of the members 16 and 18 in the columns are imaged. By repeating these steps, an angular error no greater than $2 \times 10^{-4}$ radians can be achieved.

Once the angular alignment of the chip 12 relative to the substrate 14 is established in the manner described, the translational misalignment of the chip in x and y from the substrate, if any, is then determined. To determine if any such misalignment is present, the camera 30 is displaced by the slide 26 to now capture the image of at least a portion of a first (i.e., outermost) row of first and second conductive members 16 and 18, respectively, on the chip 12 and substrate 14, respectively, along the first side thereof facing the camera. An operator observes the images of the first and second conductive members 16 and 18 captured by the cameras 30 and 32 and displayed on the monitors 33 and 34, respectively. Based on the images displayed on the monitors 33 and 34, the operator controls the x and y movement, respectively, of the slide 24 so that each first conductive member 16 within the image captured by a respective one of the cameras 30 or 32 is aligned with its corresponding second member 18.

After operating the slide 24 as necessary to establish alignment of the first and second conductive members 16 and 18, within the images displayed on the monitors 33 and 34, the cameras 30 and 32 are then displaced by their slides 26 and 28, respectively. In this way, the cameras 30 and 32 capture the image of another set of first and second conductive members 16 and 18 in the first row and first column, respectively, of first and second conductive members 16 and 18 on the chip 12 and substrate 14, respectively, closest to a separate one of the cameras. The operator then observes the image of the first and second members 16 and 18 displayed on each of the monitors 33 and 34. It may well be that the first and second members 16 and 18 were not exactly aligned following the initial translation of the slide 24, and thus further translation of the slide may be required. Therefore, the process of displacing the two cameras 30 and 32, observing the alignment between the first and second conductive members 16 and 18, and then displacing the slide 24 to correct for any observed offset may have to be repeated several times to assure precise alignment. Even if this process is repeated several times, along with repeating the angular alignment process previously described, alignment of the first conductive members 16 on the chip 12 to the second conductive member 18 on the substrate 14, respectively, can be carried out quickly with an alignment accuracy of two microns.

The foregoing describes a technique for aligning each of a plurality of depending first conductive members 16, arranged in an array of orthogonal rows and columns on a chip 12, to a corresponding one of a plurality of second conductive members 18 arranged in a like array on a substrate 14. A distinct advantage of the foregoing method is that height uniformity of the first and second conductive members 16 and 18 on the chip 12 and substrate 14, respectively, is not critical as long as the height of the members exceeds a minimum value, since at least some of the members are constantly being observed during the placement process. Therefore, no trade-off needs to be made during the fabrication of the chip 12 and substrate 14 between height uniformity and the lift-off profile. Also, since at least a portion of the first and second conductive members 16 and 18 on the chip 12 and substrate 14, respectively, can be viewed continuously during bonding using the system 20, post-bonding inspection may be eliminated. Further, the above-described alignment process is independent of the size of the chip 12. Thus, the alignment process of the invention may readily be used to align small chips 12 (typically 0.64 cm) as well as those which are much larger with no loss in accuracy.

It is to be understood that the above-described embodiments are merely illustrative of the principles of the invention. Various modifications and changes may be made thereto by those skilled in the art which will embody the principles of the invention and fall within the spirit and scope thereof. For example, a machine vision processor (not shown) may be coupled to each of the cameras 30 and 32 for processing the images captured by each one to determine the offset between the first and second conductive members 16 and 18 and for operating the end effector 52 and the slide 24 in accordance with the offset to accomplish alignment of the members.

We claim:

1. Apparatus for registering an article with a substrate such that each of a plurality of first conductive members depending from the article in an array of orthogonal rows and columns is aligned with a separate one of a plurality of second conductive members in a like array on the substrate, comprising:

a substrate holder for holding the substrate;

means for laterally translating the substrate holder along each of a pair of orthogonal axes;

means for holding the article in spaced relationship from the substrate such that each one of said first conductive members is proximate to a corresponding one of said second conductive members;

a first television camera trained at a first end of the article and substrate for capturing the image of at least a portion of a first column of said first and second conductive members, on the article and substrate, respectively, at a first end;

a second television camera trained at a first side of the article and substrate orthogonal to the first end thereof for capturing the image of at least a portion of a first row of said first and second conductive members on the article and substrate, respectively;

a mirror positioned proximate a second end of the article and the substrate, opposite the first end thereof, for reflecting an image of a portion of a second column of said first and second conductive members on the article and substrate, respectively, at said second end thereof;

means for displacing the second camera along an axis parallel to the first side of the article for positioning the second camera at a location at which it can capture the image reflected by the mirror;

a first monitor coupled to, for displaying the image captured by, the first camera; and a second monitor coupled to, for displaying the image captured by, the second camera.

2. The apparatus according to claim 1 further including means for displacing the first camera along an axis parallel to the first end of the article and the substrate.

3. The apparatus according to claim 2 wherein each of the first and second cameras includes a first means for illuminating its field of view with dark field illumination.

4. The apparatus according to claim 2 further including second means for illuminating the first side of the article and the substrate imaged by the second camera with dark field illumination.

* * * * *